United States Patent
Rose et al.

(10) Patent No.: US 8,023,612 B2
(45) Date of Patent: Sep. 20, 2011

(54) SHIFT REGISTER WITH DYNAMIC ENTRY POINT PARTICULARLY USEFUL FOR ALIGNING SKEWED DATA

(75) Inventors: Kenneth Michael Rose, Palo Alto, CA (US); Matthew Todd Lawson, Grass Valley, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 12/238,243

(22) Filed: Sep. 25, 2008

(65) Prior Publication Data
US 2010/0074391 A1    Mar. 25, 2010

(51) Int. Cl.
*G11C 19/00* (2006.01)
*H03H 11/26* (2006.01)

(52) U.S. Cl. .......... 377/70; 327/141; 327/276; 327/269; 327/270

(58) Field of Classification Search .................. None
See application file for complete search history.

(56) References Cited

U.S. PATENT DOCUMENTS

| | | | | |
|---|---|---|---|---|
| 4,016,511 | A | * | 4/1977 | Ramsey et al. ............... 333/138 |
| 5,339,079 | A | * | 8/1994 | Ledzius et al. ................ 341/144 |
| RE35,254 | E | * | 5/1996 | Chaisemartin et al. ......... 377/47 |
| 5,670,904 | A | * | 9/1997 | Moloney et al. .............. 327/277 |
| 5,754,615 | A | * | 5/1998 | Colavin .......................... 377/47 |
| 6,009,139 | A | * | 12/1999 | Austin et al. .................... 377/47 |
| 6,169,438 | B1 | * | 1/2001 | Wu et al. ....................... 327/276 |
| 6,924,675 | B2 | * | 8/2005 | Nygren ......................... 327/141 |
| 7,116,738 | B1 | | 10/2006 | Benning et al. |
| 7,268,597 | B2 | * | 9/2007 | Miller, Jr. ..................... 327/117 |
| 7,334,065 | B1 | | 2/2008 | Rose et al. |

* cited by examiner

*Primary Examiner* — Tuan Lam
(74) *Attorney, Agent, or Firm* — The Law Office of Kirk D. Williams (57) ABSTRACT

Disclosed are, inter alia, methods, apparatus, computer-storage media, mechanisms, and means associated with a shift register with a dynamic entry point, which may particularly useful for aligning skewed data. The dynamic entry shift register typically includes a series of storage elements, with multiplexers distributed between the storage elements. Each of the multiplexers is configured to select between: (a) the output signal of a previous storage element, and (b) the input signal. A control is configured to configure the multiplexers for a data signal applied as the input signal to induce an appropriate delay of the data signal as the output signal. The dynamic entry shift register can be scaled to accommodate a longer delay while still using only 2:1 multiplexers between stages in the dynamic entry shift register(s).

12 Claims, 5 Drawing Sheets

SHIFT REGISTER WITH DYNAMIC ENTRY POINT PARTICULARLY USEFUL FOR ALIGNING SKEWED DATA

TECHNICAL FIELD

The present disclosure relates generally to communications and computer systems, especially routers, packet switching systems, and other network devices.

BACKGROUND

The communications industry is rapidly changing to adjust to emerging technologies and ever increasing customer demand. This customer demand for new applications and increased performance of existing applications is driving communications network and system providers to employ networks and systems having greater speed and capacity (e.g., greater bandwidth). Therefore, these systems are designed to operate at higher speeds, which may include sending data between multiple components within a system or between systems using multiple links. Data skewing can occur when a data is partitioned and sent in parallel across multiple links, and the receiving system typically must realign the data.

BRIEF DESCRIPTION OF THE DRAWINGS

The appended claims set forth the features of the invention with particularity. The invention, together with its advantages, may be best understood from the following detailed description taken in conjunction with the accompanying drawings of which:

DESCRIPTION OF EXAMPLE EMBODIMENTS

1. Overview

Disclosed are, inter alia, methods, apparatus, computer-storage media, mechanisms, and means associated with a shift register with a dynamic entry point, which may particularly useful for aligning skewed data.

In one embodiment, the dynamic entry shift register includes: a shift register including a series of storage elements, with the first element configured to receive an input signal, and with the last element configured to produce an output signal. Multiple multiplexers are distributed between the storage elements, with each of the multiplexers coupled to select between: (a) the output signal of a previous storage element, and (b) the input signal. The output of each of the multiplexers is coupled to the input of the next storage element in the series of storage elements. A control is configured to control the multiplexers for a data signal applied as the input signal to induce an appropriate delay of the data signal as the output signal.

One embodiment includes: m dynamic entry shift registers, with each of the dynamic entry shift registers configured to receive a different signal applied as its input signal. The dynamic entry shift registers are configured to align m different signals applied as the input signals to the m dynamic entry shift registers, with m being an integer greater than one.

One embodiment includes: s parallel dynamic entry shift registers, with each including one or more, but typically a plurality of dynamic entry shift registers, with each of the dynamic entry shift registers being configured to receive a different input signal. Each of the dynamic entry shift registers within a single parallel dynamic entry shift register is configured to cause a same delay of its respective input signal. The control is configured to induce one or more appropriate delays in the s parallel dynamic entry shift registers as necessary to align said data signals among said s parallel dynamic entry shift registers.

In one embodiment, each of the multiplexers are 2:1 multiplexers. In one embodiment, the storage elements includes n storage elements; and the multiplexers are configurable in at least n different ways to cause the input signal to flow through a different number, ranging from one to n, of storage elements. In one embodiment, n is an integer greater than three.

2. Description

Embodiments described herein include various elements and limitations, with no one element or limitation contemplated as being a critical element or limitation. Each of the claims individually recites an aspect of the invention in its entirety. Moreover, some embodiments described may include, but are not limited to, inter alia, systems, networks, integrated circuit chips, embedded processors, ASICs, methods, and computer-readable media containing instructions. One or multiple systems, devices, components, etc. may comprise one or more embodiments, which may include some elements or limitations of a claim being performed by the same or different systems, devices, components, etc. The embodiments described hereinafter embody various aspects and configurations within the scope and spirit of the invention, with the figures illustrating exemplary and non-limiting configurations. Note, computer-readable media and means for performing methods and processing block operations are disclosed and are in keeping with the extensible scope and spirit of the invention.

Note, the steps, connections, and processing of signals and information illustrated in the figures, including, but not limited to any block and flow diagrams and message sequence charts, may typically be performed in the same or in a different serial or parallel ordering and/or by different components and/or processes, threads, etc., and/or over different connections and be combined with other functions in other embodiments, unless this disables the embodiment or a sequence is explicitly or implicitly required (e.g., for a sequence of read the value, process said read value—the value must be obtained prior to processing it, although some of the associated processing may be performed prior to, concurrently with, and/or after the read operation).

The term "one embodiment" is used herein to reference a particular embodiment, wherein each reference to "one embodiment" may refer to a different embodiment, and the use of the term repeatedly herein in describing associated features, elements and/or limitations does not establish a cumulative set of associated features, elements and/or limitations that each and every embodiment must include, although an embodiment typically may include all these features, elements and/or limitations. In addition, the terms "first," "second," etc. are typically used herein to denote different units (e.g., a first element, a second element). The use of these terms herein does not necessarily connote an ordering such as one unit or event occurring or coming before another, but rather provides a mechanism to distinguish between particular units. Moreover, the phrases "based on x" and "in response to x" are used to indicate a minimum set of items "x" from which something is derived or caused, wherein "x" is extensible and does not necessarily describe a complete list of items on which the operation is performed, etc. Additionally, the phrase "coupled to" is used to indicate some level of direct or indirect connection between two elements or devices, with the coupling device or devices modifying or not modifying the coupled signal or communicated information. Moreover, the term "or" is used herein to identify a selection of one or more, including all, of the conjunctive items. Additionally, the transitional term "comprising," which is synonymous with "including," "containing," or "characterized by," is inclusive or open-ended and does not exclude additional, unrecited elements or method steps.

Disclosed are, inter alia, methods, apparatus, computer-storage media, mechanisms, and means associated with a shift register with a dynamic entry point, which may particularly useful for aligning skewed data.

One embodiment includes an apparatus, comprising: a dynamic entry shift register; wherein the dynamic entry shift register includes: a shift register including a series of a plurality of storage elements, with the first element of the series of the plurality of storage elements configured to receive an input signal, and with the last element of the series of the plurality of storage elements configured to produce an output signal; a plurality of multiplexers distributed between the plurality of storage elements, with each of the plurality of multiplexers configured to select as its output between: (a) the output signal of a previous storage element in the series of the plurality of storage elements, and (b) the input signal; and with the output of each of the plurality of multiplexers coupled to the input of the next storage element in the series of the plurality of storage elements; and a control configured to control the plurality of multiplexers for a data signal applied as the input signal to induce an appropriate delay of the data signal as the output signal.

In one embodiment, each of the plurality of multiplexers are 2:1 multiplexers. In one embodiment, the plurality of storage elements includes n storage elements; and the plurality of multiplexers are configurable in at least n different ways to cause the input signal to flow through a different number, ranging from one to n, of storage elements. In one embodiment, wherein n is an integer greater than three.

One embodiment includes: m dynamic entry shift registers, with each of the plurality of dynamic entry shift registers configured to receive a different received signal applied as the input signal to each respective one of the plurality of dynamic entry shift registers; wherein the plurality of dynamic entry shift registers are configured to align m different signals applied as said input signals to said m dynamic entry shift registers, with at least one of said m dynamic entry shift registers in a configuration of its said plurality of multiplexers to cause a different delay through its said dynamic entry shift registers; wherein m is an integer greater than one. In one embodiment, each of the plurality of multiplexers are 2:1 multiplexers. In one embodiment, the plurality of storage elements includes n storage elements; and the plurality of multiplexers are configurable in at least n different ways to cause the input signal to flow through a different number, ranging from one to n, of storage elements. In one embodiment, n is an integer greater than three.

One embodiment includes: s parallel dynamic entry shift registers, each of said s parallel dynamic entry shift registers including one or more dynamic entry shift registers, with each of said one or more dynamic entry shift registers being configured to receive a different received input signal applied as its input signal, and each of said one or more dynamic entry shift registers within a single parallel dynamic entry shift register of said s parallel dynamic entry shift registers being configured to cause a same delay of its respective input signal; and wherein said control is configured to induce one or more appropriate delays in said s parallel dynamic entry shift registers as necessary to align said data signals among said s parallel dynamic entry shift registers.

In one embodiment, each of the plurality of multiplexers are 2:1 multiplexers. In one embodiment, the plurality of storage elements includes n storage elements; and the plurality of multiplexers are configurable in at least n different ways to cause the input signal to flow through a different number, ranging from one to n, of storage elements. In one embodiment, n is an integer greater than three. In one embodiment, each of said s parallel dynamic entry shift registers includes at least two dynamic entry shift registers. One embodiment includes means for detecting, on each particular parallel dynamic entry shift register of said s parallel dynamic entry shift registers, a delimiter applied as input to said particular parallel dynamic entry shift register for use in aligning data signals among said s parallel dynamic entry shift registers. In one embodiment, each of said s parallel dynamic entry shift registers includes at least two dynamic entry shift registers.

One embodiment includes a method performed by a dynamic entry shift register including a series of storage elements including a first element of the series and a plurality of storage elements following the first element in the series, with the first element of the series of the plurality of storage elements configured to receive an input signal of the dynamic entry shift register, and with the last element of the series of the plurality of storage elements configured to produce an output signal of dynamic entry shift register. In one embodiment, the method comprises: selecting by each of the plurality of storage elements, in order to induce an appropriate delay of the input signal through the dynamic entry shift register, between: (a) the output signal of a previous storage element in the series of the plurality of storage elements, and (b) the input signal; and with the output of each of the plurality of multiplexers coupled to the input of the next storage element in the series of the plurality of storage elements. One embodiment includes: dynamically configuring the shift register to change the delay through the dynamic entry shift register such that the input signal is delayed by at least one more or one less of the plurality of storage elements.

One embodiment includes: means for configuring a plurality of multiplexers in a dynamic entry shift register to induce an appropriate delayed output signal of the dynamic entry shift register for a data signal applied as an input signal to the dynamic entry shift register; wherein the dynamic entry shift register includes: a shift register including a series of a plurality of storage elements, with the first element of the series of the plurality of storage elements configured to receive the input signal, and with the last element of the series of the plurality of storage elements configured to produce the output signal; and the plurality of multiplexers distributed between the plurality of storage elements, with each of the plurality of multiplexers configured to select as its output between: (a) the output signal of a previous storage element in the series of the plurality of storage elements, and (b) the input signal; and with the output of each of the plurality of multiplexers coupled to the input of the next storage element in the series of the plurality of storage elements.

In one embodiment, each of the plurality of multiplexers are 2:1 multiplexers. In one embodiment, the plurality of storage elements includes n storage elements; and the plurality of multiplexers are configurable in at least n different ways to cause the input signal to flow through a different number, ranging from one to n, of storage elements; and wherein n is an integer greater than three.

Figure 1:
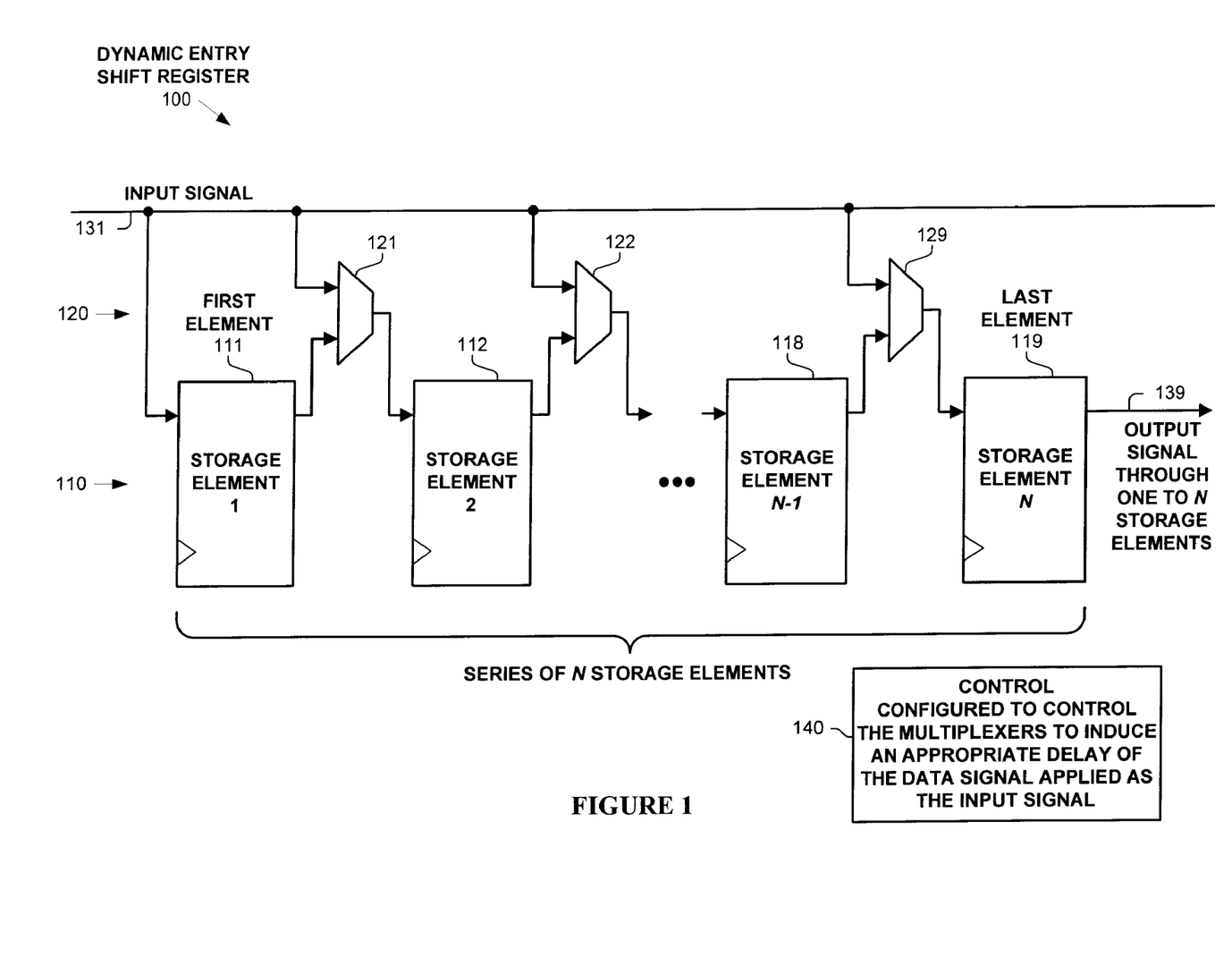
FIG. 1 illustrates a dynamic entry shift register according to one embodiment.

Expressly turning to the figures, FIG. 1 illustrates a dynamic entry shift register 100 according to one embodiment. As shown, dynamic entry shift register 100 includes n storage elements 110 (i.e., 111-119), and is configured to produce as output signal 139 the received input signal 131, delayed through up to n storage elements 110. Storage elements 110 can be implemented in numerous different ways, such as, but not limited to, flip flops, memory elements, storage array(s), registers, register array(s), etc. Typically, n storage elements 110 are synchronous, so its value is latched according to an input clock signal. Therefore, a signal sent through multiple storage elements 110 will be delayed by multiple clock ticks.

Multiplexers 120 (i.e., 121-129) are disposed between storage elements 110, so as to allow a non-first element storage element (112-119) to have as its input the original input signal 131 or the output of the immediate previous storage element (111-118). Note, in one embodiment and as shown in FIG. 1, each of multiplexers 120 are 2:1 multiplexers, which allows scalability because this number of inputs (two) does not increase as the number n of cascaded storage elements 110 increases.

Control 140 is configured to control multiplexers 120 to induce the appropriate delay of a data signal applied as input signal 131 by channeling this signal through between one and n storage elements 110. In one embodiment, control 140 is implemented in circuitry, possibly including one or more processing elements. Once input signal 131 is directed to one of storage elements 110 through one of multiplexers 120, all subsequent multiplexers (120) are configured to produce as its output the output value of the previous stage storage element (110). Also, if input signal 131 is to be delayed by n storage elements 110, then all multiplexers 120 are configured produce as its output the output value of the previous stage storage element (110). For example, if input signal is to only go through (e.g., be minimally delayed by dynamic entry shift register 100), control 140 directs multiplexer 129 to produce input signal 131 as its output, which is the input of storage element 129. If input signal 131 is to be delayed by going through two of storage elements 110, then the multiplexer (120) producing the input to storage element 118 is configured to produce input signal 131 as its output, and multiplexer 129 is configured to produce the output of storage element 118 as the input to storage element 119. If input signal 131 is to be delayed by going through n−1 of storage elements 110, then multiplexer 121 is configured to produce input signal 131 as its output, and all other multiplexers 122-129 are configured to produce as their respective output the output of their immediately preceding storage element 112-118 of the series on n storage elements 110.

Figure 2:
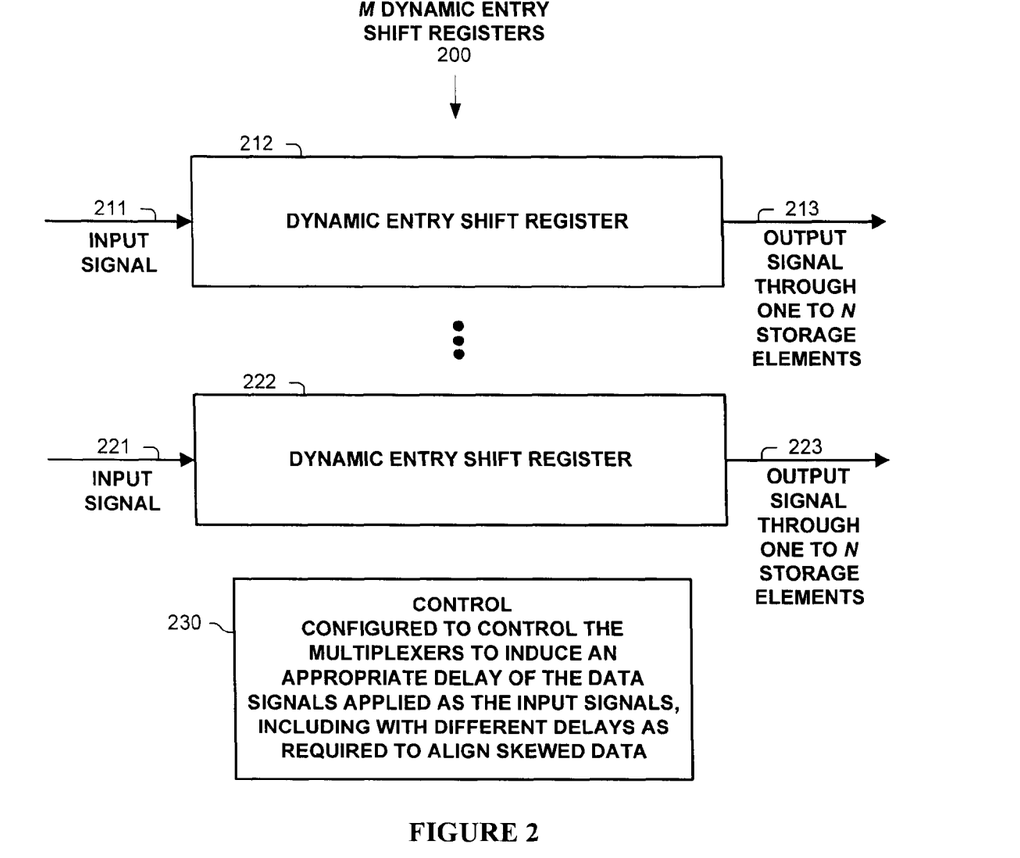
FIG. 2 illustrates multiple dynamic entry shift registers according to one embodiment.

FIG. 2 illustrates multiple dynamic entry shift registers 200 according to one embodiment. In one embodiment, each of dynamic entry shift registers 200 is implemented as illustrated and/or described in relation to dynamic entry shift register 100 of FIG. 1.

Shown in FIG. 2 are m dynamic entry shift registers 200, including: dynamic entry shift register 212 producing as output signal 213 the received input signal 211 sent through (e.g., delayed by) one to n storage elements; and dynamic entry shift register 222 producing as output signal 223 the received input signal 221 sent through (e.g., delayed by) one to n storage elements. Control 230 is configured to control the m dynamic entry shift registers 200 (e.g., by controlling their multiplexers 120 when implemented as dynamic entry shift registers 100 of FIG. 1) in order to induce an appropriate delay of data signals applied as input signals (211, 221) as to generate aligned output signals (213, 223). In one embodiment, control 230 is implemented in circuitry, possibly including one or more processing elements. The alignment of received skewed data as input signals (211, 221) may require one or more different delays through dynamic entry shift registers of the m dynamic entry shift registers 200.

Figure 3A:
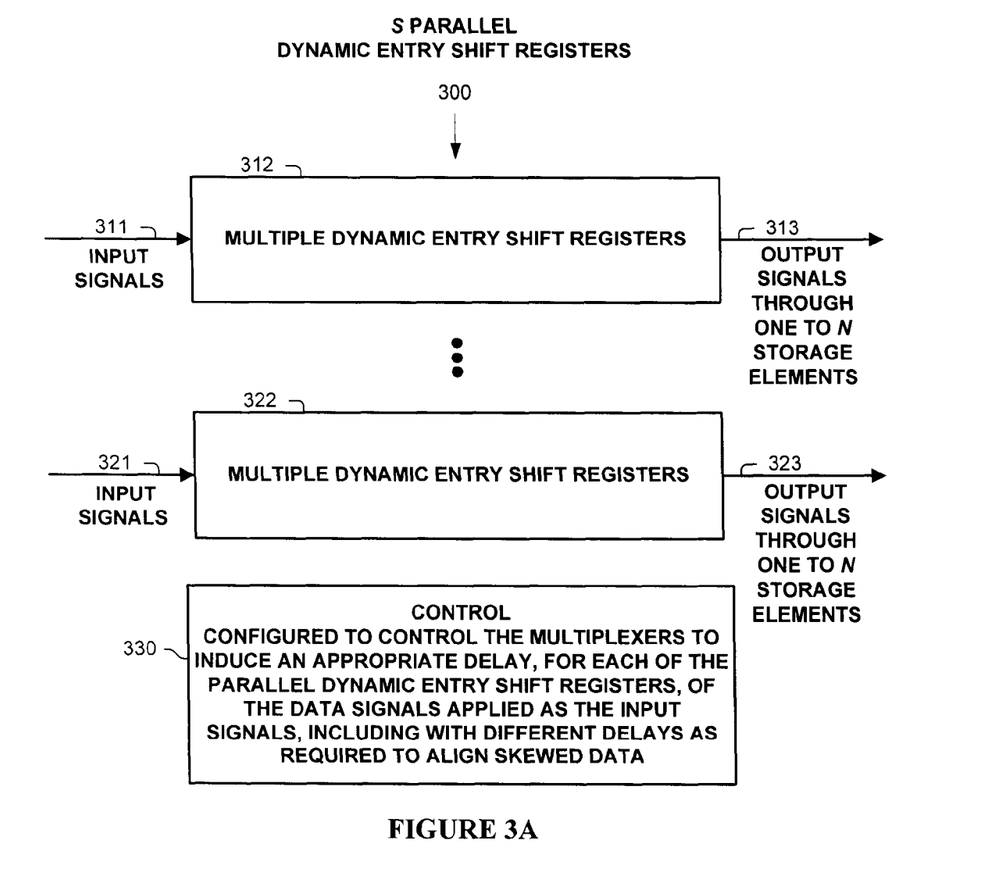
FIG. 3A illustrates multiple parallel dynamic entry shift registers according to one embodiment.

FIG. 3A illustrates multiple, s parallel dynamic entry shift registers 300 according to one embodiment. Each of the s parallel dynamic entry shift registers 300 (e.g., 312, 322) includes one or more, but typically a plurality of, dynamic entry shift registers (e.g., dynamic entry shift register 100 of FIG. 1), configured, responsive to control 330, to induce the same delay across all of its dynamic entry shift registers. However, each of the s parallel dynamic entry shift registers 300 may have different delays induced through them, as configured by control 330, to align multiple parallel sets of input data applied as input signals 311, 321 to produce aligned output signals 313, 323. In one embodiment, control 330 is implemented in circuitry, possibly including one or more processing elements.

For example, SerDes is a technology to communicate parallel data over a serial line and back to parallel data, with this output parallel data being aligned. However, if multiple SerDes serial links are used, then the parallel data produced from a SerDes serial link is aligned, but the sets of parallel data produced from multiple SerDes serial links might be skewed. One embodiment, using a parallel dynamic entry shift register for each set of parallel data, is used to align data among all of the parallel sets of data.

Figure 3B:
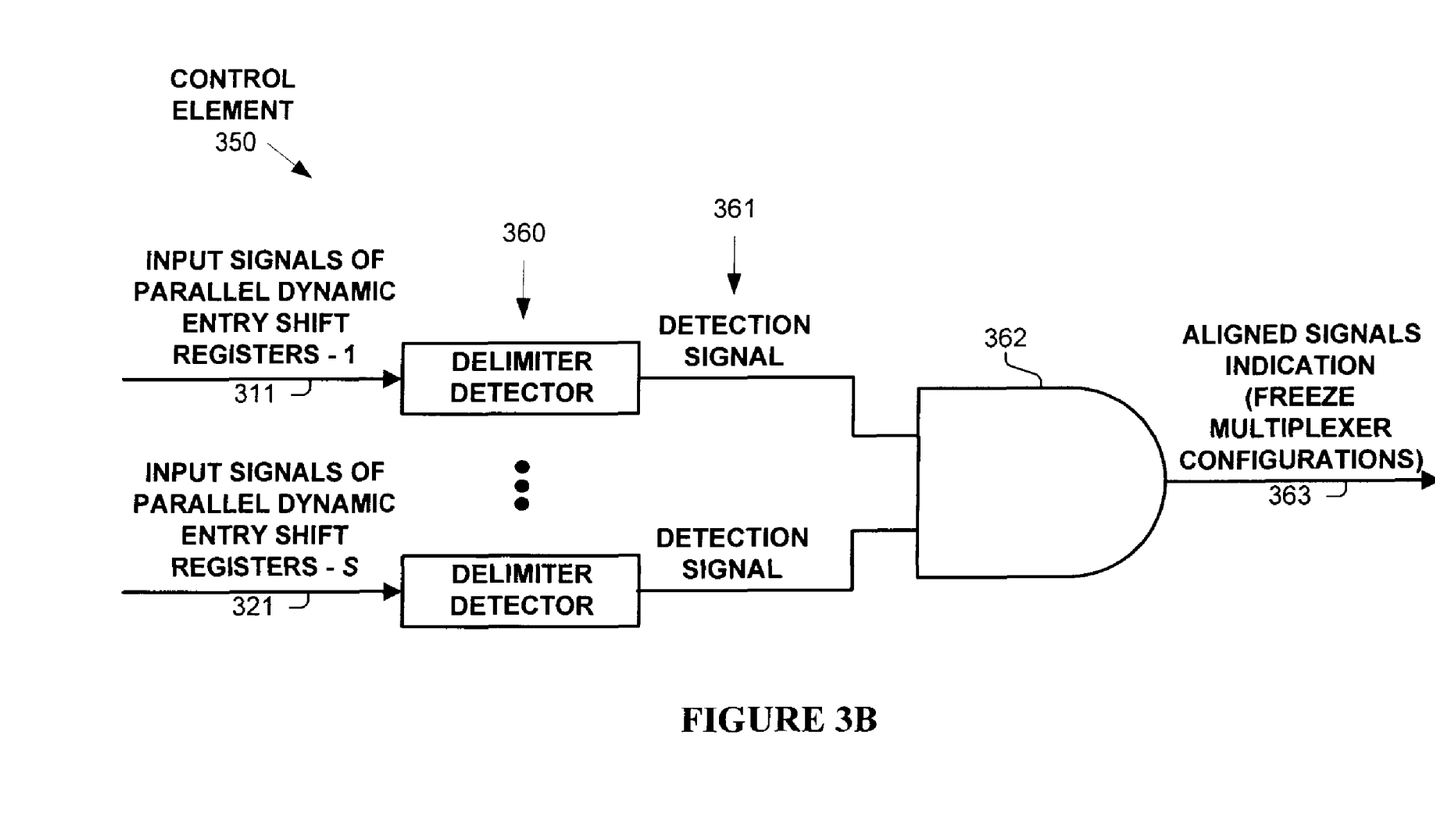
FIG. 3B illustrates a detection circuit used in one embodiment.

FIG. 3B illustrates a control element used in one embodiment in aligning the data among the s parallel dynamic entry shift registers 300 of FIG. 3A. This data alignment is performed using a delimiter (e.g., a unique character) received on each of the input signals 311 and 321. A delimiter detector 360 (e.g., a comparison circuit looking for the receipt of the delimiter) is communicatively coupled to each of the sets of input signals 311, 321. In response to a detected delimiter character, a detection signal 361 is generated and maintained (e.g., until a reset causing a realignment of data, for example). When all delimiter detectors 360 have identified a received delimiter as determined by a simple AND operation 362 (or the like) on detection signals 361, then the data across the s parallel dynamic entry shift registers 300 of FIG. 3A will be aligned, as indicated by aligned signal 363 (e.g., freeze multiplexer configurations as described hereinafter).

Figure 3C:
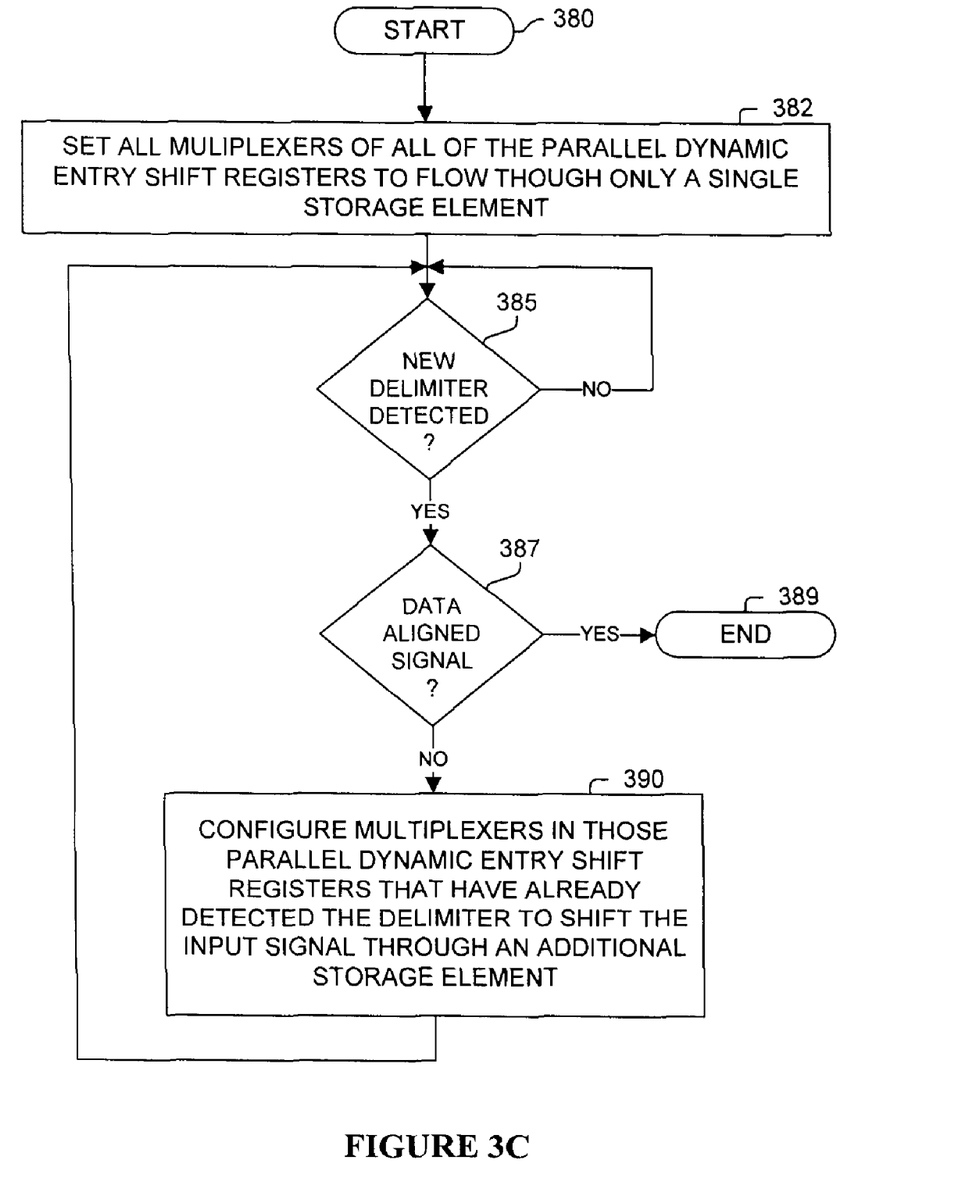
FIG. 3C illustrates a process performed in one embodiment.

FIG. 3C illustrates a process performed in one embodiment for aligning data among multiple parallel dynamic entry shift registers (e.g., s parallel dynamic entry shift registers 300 of FIG. 3A), such as those each comprising one or more, but typically multiple, dynamic entry shift registers (e.g., dynamic entry shift registers 100 of FIG. 1).

Processing of the flow diagram of FIG. 3C begins with process block 380. In process block 382, all multiplexers in all of the parallel dynamic entry shift registers are set to flow through only a single storage element. For example, in an embodiment using a dynamic entry shift register 100 of FIG. 1, input signal 131 is set to pass through multiplexer 129 to last storage element 119 and then as output signal 139. Until a new (e.g., first or an additional) delimiter is detected as the input signals received on one or more of the parallel dynamic entry shift registers, processing remains with process block 385. Otherwise, as determined in process block 387, if a delimiter has been received on all of the parallel dynamic entry shift registers (e.g., as determined by signal 363 of FIG. 3B), then the signals have been aligned, and processing of the flow diagram of FIG. 3C is complete as indicated by process block 389. Otherwise, the multiplexers are adjusted in process block 390 to cause the multiplexers in each of the parallel dynamic entry shift registers that have already received (and detected) their delimiter, to cause the input signal to flow through one additional storage element in order to induce an additional clock delay on each of these sets of signals. Processing then returns to process block 385.

In other words, one embodiment causes an additional one clock period delay through each parallel dynamic entry shift register that has already received its delimiter, for each clock period that all parallel dynamic entry shift registers have not received their delimiter. Therefore, the input signals to the last parallel dynamic entry shift register(s) to receive their delimiters will each only pass through one storage element of a dynamic entry shift register, while those which previously received it will have its input signals accordingly delayed to align the data across all parallel dynamic entry shift registers.

In view of the many possible embodiments to which the principles of our invention may be applied, it will be appreciated that the embodiments and aspects thereof described herein with respect to the drawings/figures are only illustrative and should not be taken as limiting the scope of the invention. For example, and as would be apparent to one skilled in the art, many of the process block operations can be re-ordered to be performed before, after, or substantially concurrent with other operations. Also, many different forms of data structures could be used in various embodiments. The invention as described herein contemplates all such embodiments as may come within the scope of the following claims and equivalents thereof.

What is claimed is:

1. An apparatus, comprising:
   m dynamic entry shift registers, with each of said m dynamic entry shift registers configured to receive a different signal applied as an input signal and to generate a different output signal corresponding to its input signal; wherein m is an integer greater than one; wherein said m dynamic entry shift registers are configured to generate an aligned m said output signals of said m dynamic entry shift registers, with at least a first dynamic shift register of said m dynamic entry shift registers in a configuration to cause a different delay through the first dynamic shift register than at least one other of said m dynamic entry shift registers; and
   control circuitry configured to align said different signals based on detected one or more delimiters included in each of said different signals said applied to said m dynamic entry shift registers; wherein said aligning includes adjusting the delay through a particular one or more of said m dynamic entry shift registers for which said one or more delimiters are received in a particular one or more of said different signals corresponding to the particular one or more of said m dynamic entry shift registers at a different bit time than in a different particular one or more of said different signals corresponding to a different particular one or more of said m dynamic entry shift registers;
   wherein each particular dynamic shift register of said m dynamic entry shift registers is configured to receive a particular input signal of said m different signals and to produce a particular output signal of the aligned m said output signals; wherein the particular output signal is a same serial sequence of bits delayed by one or more bit times.

2. The apparatus of claim 1, wherein said adjusting the delay through one or more of said m dynamic entry shift registers includes: adjusting each of the particular one or more of said m dynamic entry shift registers to add one more bit time delay through each of the particular one or more of said m dynamic entry shift registers; wherein said one or more delimiters are received in the particular one or more of said different signals at an earlier bit time than in the different particular one or more of said different signals.

3. The apparatus of claim 2, wherein each said dynamic entry shift register includes:
   a shift register including a series of a plurality of storage elements, with the first storage element of the series of the plurality of storage elements configured to receive the particular input signal, and with the last storage element of the series of the plurality of storage elements configured to produce the particular output signal;
   a plurality of multiplexers distributed between the plurality of storage elements, with one of the plurality of multiplexers disposed between each pair of consecutive storage elements of the plurality of storage elements, with each of the plurality of multiplexers configured to select as its output between: (a) the output signal of a previous storage element in the series of the plurality of storage elements, and (b) the particular input signal; and with the output of each of the plurality of multiplexers coupled to the input of the next storage element in the series of the plurality of storage elements; and
   a control configured to control the plurality of multiplexers to induce an appropriate delay of the particular input signal through the particular dynamic shift register;
   wherein each of the plurality of multiplexers are 2:1 multiplexers; and
   wherein the plurality of storage elements includes n storage elements; and the plurality of multiplexers are configurable to cause each bit of the serial sequence of bits of the particular input signal to flow through a same number k of said n storage elements to be produced as the particular output signal, with k ranging from one to n.

4. The apparatus of claim 3, wherein n is an integer greater than three.

5. The apparatus of claim 1, wherein each said dynamic entry shift register includes:
   a shift register including a series of a plurality of storage elements, with the first storage element of the series of the plurality of storage elements configured to receive the particular input signal, and with the last storage element of the series of the plurality of storage elements configured to produce the particular output signal;
   a plurality of multiplexers distributed between the plurality of storage elements, with one of the plurality of multiplexers disposed between each pair of consecutive storage elements of the plurality of storage elements, with each of the plurality of multiplexers configured to select as its output between: (a) the output signal of a previous storage element in the series of the plurality of storage elements, and (b) the particular input signal; and with the output of each of the plurality of multiplexers coupled to the input of the next storage element in the series of the plurality of storage elements; and
   a control configured to control the plurality of multiplexers to induce an appropriate delay of the particular input signal through the particular dynamic shift register;
   wherein each of the plurality of multiplexers are 2:1 multiplexers; and
   wherein the plurality of storage elements includes n storage elements; and the plurality of multiplexers are configurable to cause each bit of the serial sequence of bits of the particular input signal to flow through a same number k of said n storage elements to be produced as the particular output signal, with k ranging from one to n.

6. The apparatus of claim 5, wherein n is an integer greater than three.

7. A method, comprising:
performing one or more operations in an apparatus including: m dynamic entry shift registers, with each of said m dynamic entry shift registers configured to receive a different signal applied as an input signal and to generate a different output signal corresponding to its input signal; wherein m is an integer greater than one; wherein said m dynamic entry shift registers are configured to generate an aligned m said output signals of said m dynamic entry shift registers, with at least a first dynamic shift register of said m dynamic entry shift registers in a configuration to cause a different delay through the first dynamic shift register than at least one other of said m dynamic entry shift registers; wherein each particular dynamic shift register of said m dynamic entry shift registers is configured to receive a particular input signal of said m different signals and to produce a particular output signal of the aligned m said output signals; wherein the particular output signal is a same serial sequence of bits delayed by one or more bit times; and wherein said operations include:
detecting one or more delimiters included in each of said different signals said applied to said m dynamic entry shift registers; and
adjusting the delay through a particular one or more of said m dynamic entry shift registers for which said one or more delimiters are received in a particular one or more of said different signals corresponding to the particular one or more of said m dynamic entry shift registers at a different bit time than in a different particular one or more of said different signals corresponding to a different particular one or more of said m dynamic entry shift registers.

8. The method of claim 7, wherein said adjusting the delay through one or more of said m dynamic entry shift registers includes: adjusting each of the particular one or more of said m dynamic entry shift registers to add one more bit time delay through each of the particular one or more of said m dynamic entry shift registers; wherein said one or more delimiters are received in the particular one or more of said different signals at an earlier bit time than in the different particular one or more of said different signals.

9. The method of claim 8, wherein each said dynamic entry shift register includes:
a shift register including a series of a plurality of storage elements, with the first storage element of the series of the plurality of storage elements configured to receive the particular input signal, and with the last storage element of the series of the plurality of storage elements configured to produce the particular output signal;
a plurality of multiplexers distributed between the plurality of storage elements, with one of the plurality of multiplexers disposed between each pair of consecutive storage elements of the plurality of storage elements, with each of the plurality of multiplexers configured to select as its output between: (a) the output signal of a previous storage element in the series of the plurality of storage elements, and (b) the particular input signal; and with the output of each of the plurality of multiplexers coupled to the input of the next storage element in the series of the plurality of storage elements; and
a control configured to control the plurality of multiplexers to induce an appropriate delay of the particular input signal through the particular dynamic shift register;
wherein each of the plurality of multiplexers are 2:1 multiplexers; and
wherein the plurality of storage elements includes n storage elements; and the plurality of multiplexers are configurable to cause each bit of the serial sequence of bits of the particular input signal to flow through a same number k of said n storage elements to be produced as the particular output signal, with k ranging from one to n.

10. The method of claim 9, wherein n is an integer greater than three.

11. The method of claim 7, wherein each said dynamic entry shift register includes:
a shift register including a series of a plurality of storage elements, with the first storage element of the series of the plurality of storage elements configured to receive the particular input signal, and with the last storage element of the series of the plurality of storage elements configured to produce the particular output signal;
a plurality of multiplexers distributed between the plurality of storage elements, with one of the plurality of multiplexers disposed between each pair of consecutive storage elements of the plurality of storage elements, with each of the plurality of multiplexers configured to select as its output between: (a) the output signal of a previous storage element in the series of the plurality of storage elements, and (b) the particular input signal; and with the output of each of the plurality of multiplexers coupled to the input of the next storage element in the series of the plurality of storage elements; and
a control configured to control the plurality of multiplexers to induce an appropriate delay of the particular input signal through the particular dynamic shift register;
wherein each of the plurality of multiplexers are 2:1 multiplexers; and
wherein the plurality of storage elements includes n storage elements; and the plurality of multiplexers are configurable to cause each bit of the serial sequence of bits of the particular input signal to flow through a same number k of said n storage elements to be produced as the particular output signal, with k ranging from one to n.

12. The method of claim 11, wherein n is an integer greater than three.

* * * * *